(12) United States Patent
Chen et al.

(10) Patent No.: US 10,588,409 B2
(45) Date of Patent: Mar. 17, 2020

(54) RACK SYSTEM AND SLIDE RAIL ASSEMBLY THEREOF

(71) Applicants: King Slide Works Co., Ltd., Kaohsiung (TW); King Slide Technology Co., Ltd., Kaohsiung (TW)

(72) Inventors: Ken-Ching Chen, Kaohsiung (TW); Shun-Ho Yang, Kaohsiung (TW); Mei-Zuo Guo, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 15/921,875

(22) Filed: Mar. 15, 2018

(65) Prior Publication Data

US 2019/0082835 A1 Mar. 21, 2019

(30) Foreign Application Priority Data

Sep. 15, 2017 (TW) .............................. 106132001 A

(51) Int. Cl.
*A47B 88/42* (2017.01)
*H05K 7/14* (2006.01)
(Continued)

(52) U.S. Cl.
CPC ............ *A47B 88/427* (2017.01); *A47B 96/06* (2013.01); *H02B 1/36* (2013.01); *H05K 7/1411* (2013.01); *H05K 7/1489* (2013.01); *H05K 7/183* (2013.01)

(58) Field of Classification Search
CPC . A47B 88/427; A47B 88/0422; A47B 88/423; A47B 88/0418; A47B 88/43; A47B 88/044; A47B 88/40; A47B 96/06; A47B 2210/0059; H02B 1/36; H05K 7/1411; H05K 7/1489; H05K 7/183; H05K 7/1488;
(Continued)

(56) References Cited

U.S. PATENT DOCUMENTS 2,708,088 A * 5/1955 Steinke ................ H05K 7/1421
248/221.12
4,285,560 A * 8/1981 Miller .................. A47B 88/493
108/83
(Continued)

FOREIGN PATENT DOCUMENTS

DE 3239372 A1 * 7/1984 ........... A47B 88/493
DE 102013108217 B3 * 10/2014 ........... H05K 7/1489
(Continued)

*Primary Examiner* — Andrew M Roersma
(74) *Attorney, Agent, or Firm* — Alan D. Kamrath; Karin L. Williams; Mayer & Williams PC

(57) ABSTRACT

A slide rail assembly is applicable to a carried object. The carried object has a first side and a second side, and includes a front part and a rear part. The slide rail assembly includes a first rail, a bracket, a second rail and a supporting member. The bracket is attached to the first rail. The second rail is movable relative to the first rail. The second rail is configured to be connected to the first side of the rear part of the carried object. The supporting member is arranged on the bracket. When the second rail is located at a predetermined position relative to the first rail, the supporting member is configured to support the front part of the carried object.

11 Claims, 7 Drawing Sheets

(51) Int. Cl.
 *A47B 96/06* (2006.01)
 *H02B 1/36* (2006.01)
 *H05K 7/18* (2006.01)
 *A47B 88/427* (2017.01)

(58) Field of Classification Search
 CPC ... H05K 7/1485; H05K 7/1487; H05K 7/1421
 See application file for complete search history.

(56) References Cited

U.S. PATENT DOCUMENTS

| | | | |
|---|---|---|---|
| 6,609,619 B2 | 8/2003 | Abbott | |
| 6,681,942 B2 * | 1/2004 | Haney | H05K 7/1421 |
| | | | 211/183 |
| 6,929,336 B2 * | 8/2005 | Liu | H05K 7/1421 |
| | | | 312/223.1 |
| 7,364,244 B2 | 4/2008 | Sandoval | |
| 8,469,467 B2 * | 6/2013 | Chang | H05K 7/1489 |
| | | | 211/26 |
| 9,101,073 B2 * | 8/2015 | Sun | H05K 7/1488 |
| 9,375,087 B1 * | 6/2016 | Chen | A47B 88/43 |
| 9,848,702 B2 | 12/2017 | Chen et al. | |
| 9,867,462 B2 | 1/2018 | Chen et al. | |
| 2010/0123377 A1 * | 5/2010 | Hsu | H05K 7/1491 |
| | | | 312/330.1 |
| 2015/0077923 A1 | 3/2015 | Rauline | |
| 2016/0316585 A1 * | 10/2016 | Lu | H05K 7/1487 |
| 2016/0324317 A1 * | 11/2016 | Chen | A47B 88/43 |
| 2017/0340109 A1 | 11/2017 | Chen et al. | |

FOREIGN PATENT DOCUMENTS

| | | | | |
|---|---|---|---|---|
| EP | 0367274 A2 * | 5/1990 | | A47B 88/43 |
| EP | 2153749 A2 * | 2/2010 | | A47B 88/40 |
| EP | 3157313 A2 | 4/2017 | | |
| GB | 2490983 A * | 11/2012 | | A47B 88/493 |
| JP | H02149215 A | 6/1990 | | |
| JP | 2017027591 A | 2/2017 | | |

* cited by examiner

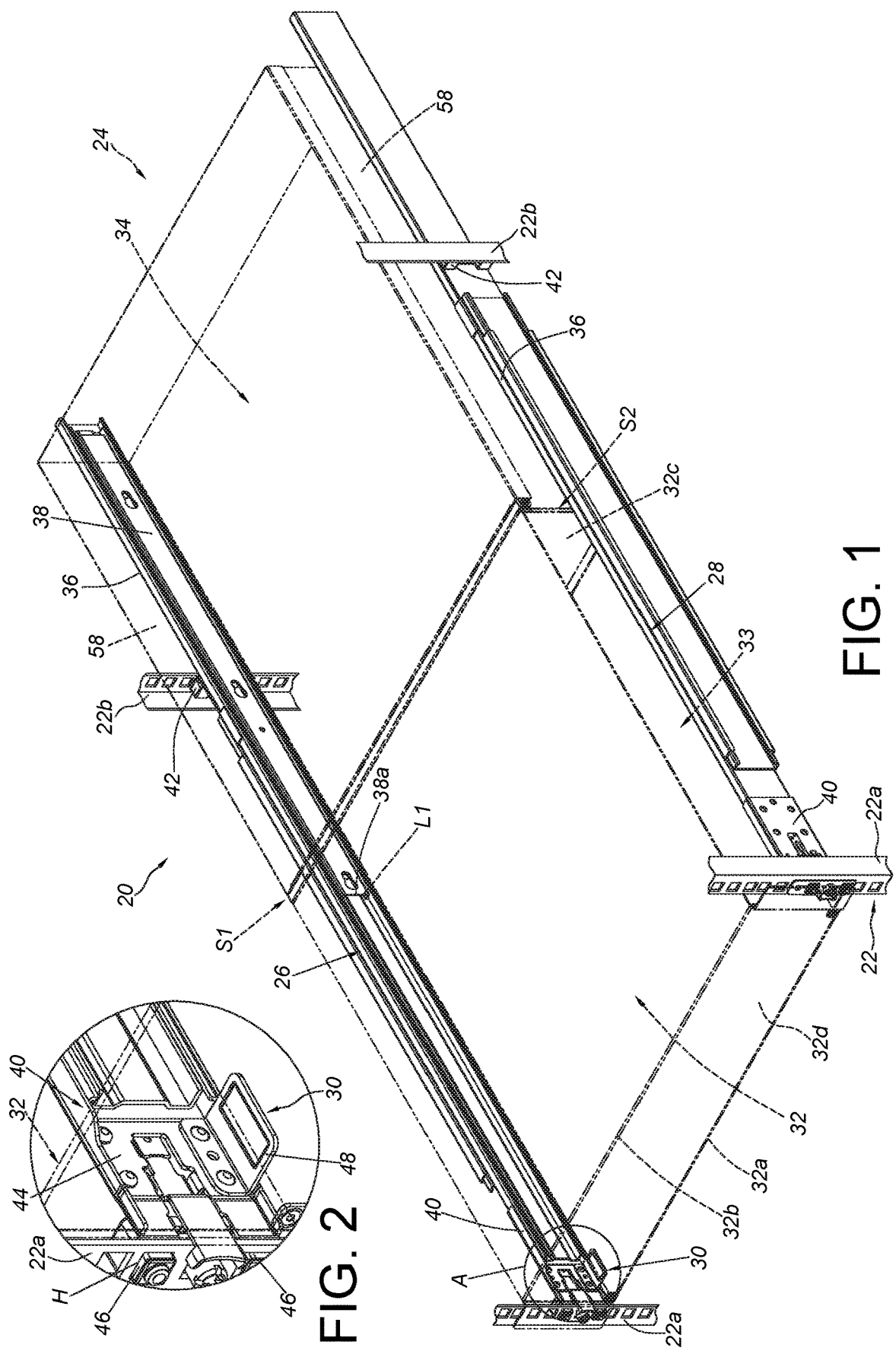

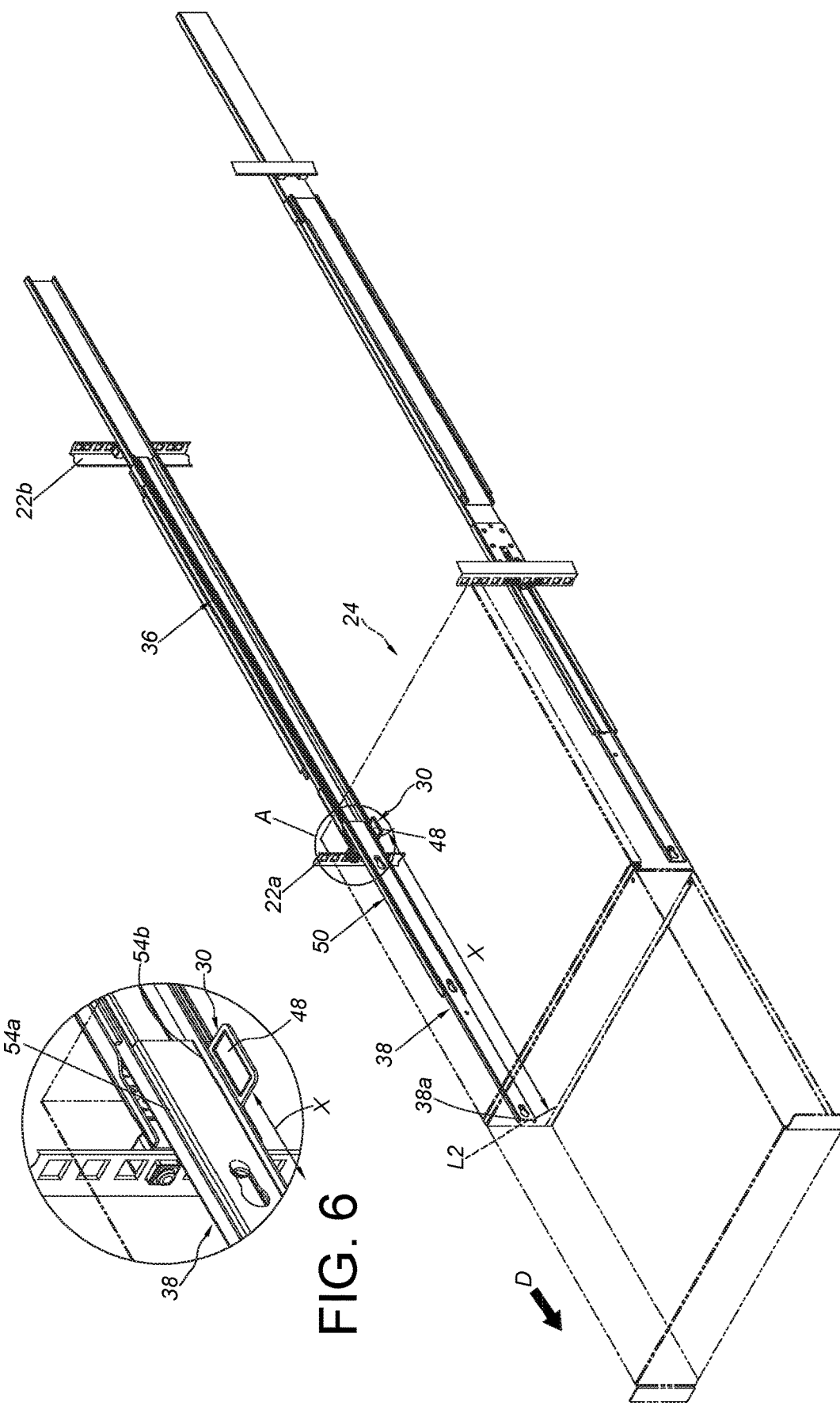

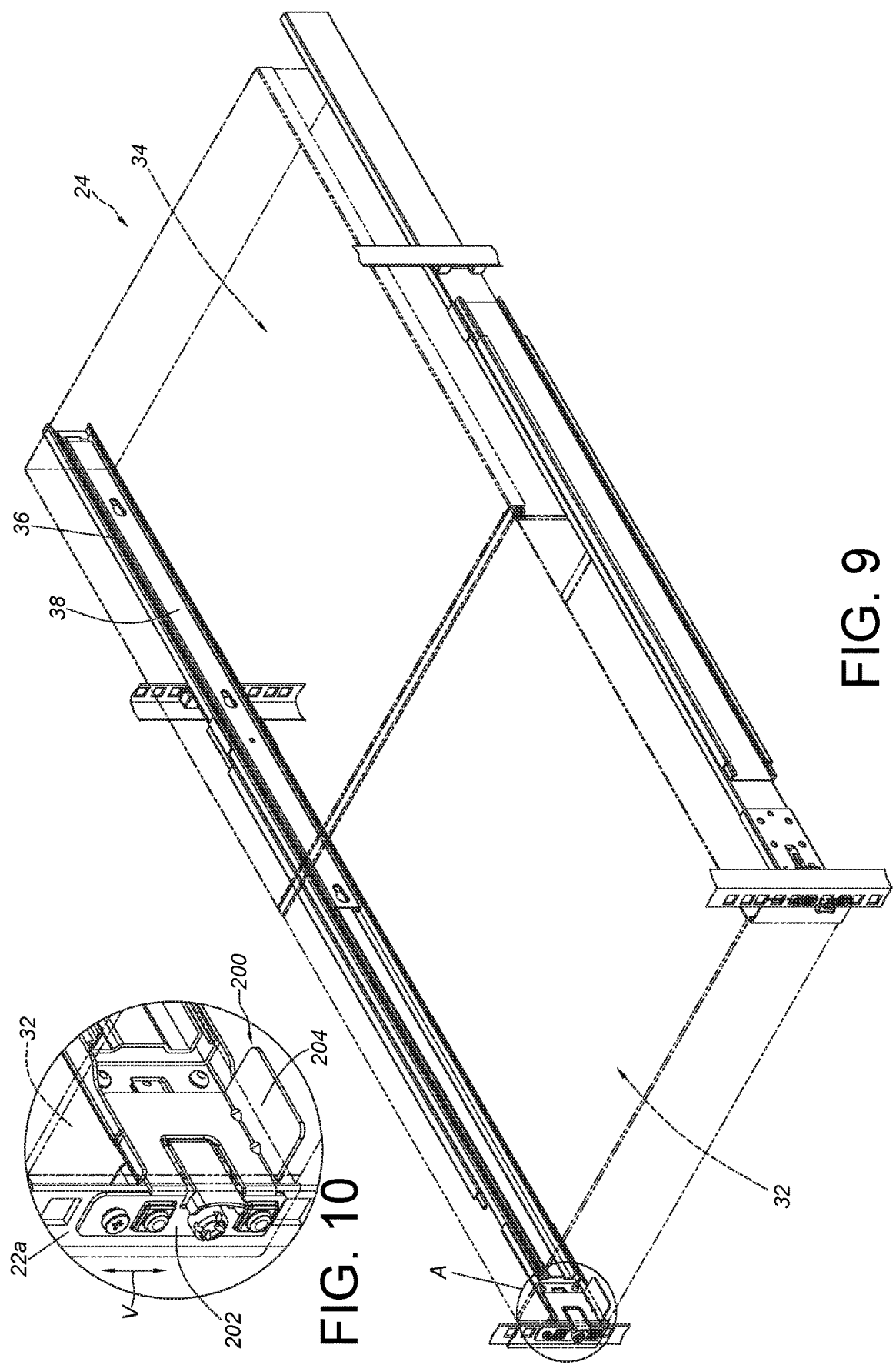

RACK SYSTEM AND SLIDE RAIL ASSEMBLY THEREOF

BACKGROUND OF THE INVENTION

1. Field of the Invention

The present invention relates to a slide rail assembly for a rack system, and more particularly, to a rack system or a slide rail assembly with a supporting mechanism for supporting a carried object.

2. Description of the Prior Art

Generally, in a rack system, a carried object (such as an electronic device) is usually mounted to a rack through a pair of slide rail assemblies. Wherein, each of the slide rail assemblies usually comprises a fixed rail fixed to the rack, and a movable rail movable relative to the fixed rail, in order to allow the electronic device to be moved out of the rack or to be pushed into the rack.

However, for some specific mounting space or structure (or shape) of the carried object, the movable rail can be only connected to or mounted to a specific portion of carried object. Therefore, it is important to improve support reliability of the slide rail assembly to the carried object.

SUMMARY OF THE INVENTION

The present invention relates to a rack system or a slide rail assembly with a supporting mechanism for supporting a carried object.

According to an embodiment of the present invention, a rack system comprises a rack, a carried object, a first slide rail assembly, a second slide rail assembly and a supporting member. The carried object has a first side and a second side. The carried object comprises a front part and a rear part. The first side of the front part and the first side of the rear part of the carried object are substantially on a same plane, and the second side of the front part and the second side of the rear part of the carried object are substantially on a same plane. Wherein, the front part is formed with a space inside, and the first side of the front part has an opening communicated with the space. The first slide rail assembly and the second slide rail assembly are respectively arranged at two opposite sides of the rack. Each of the slide rail assemblies comprises a first rail and a second rail movable relative to the first rail. Each of the first rails of the slide rail assemblies is mounted to a post of the rack through a bracket, and the second rail of the first slide rail assembly and the second rail of the second slide rail assembly are respectively mounted to the first side and the second side of the rear part. The supporting member is connected to one of the bracket and the post. Wherein, when the second rail is located at a predetermined position relative to the first rail, the supporting member is configured to support the front part of the carried object.

Preferably, the supporting member comprises a supporting part, and the supporting part is laterally arranged relative to a height direction of one of the bracket and the post. When the second rail is located at the predetermined position, the supporting part is configured to support a bottom of the front part of the carried object.

Preferably, the supporting member further comprises a connecting part. The connecting part is substantially perpendicularly bent relative to the supporting part. The supporting part is connected to one of the bracket and the post through the connecting part.

Preferably, the supporting member is fixedly connected to one of the bracket and the post.

Preferably, each of the first slide rail assembly and the second slide rail assembly further comprises a third rail. The third rail is movably mounted between the first rail and the second rail for extending a traveling distance of the second rail relative to the first rail.

Preferably, the second rail is shorter than the first rail and the third rail.

According to another embodiment of the present invention, a slide rail assembly comprises a first rail, a bracket, a second rail and a supporting member. The bracket is attached to the first rail. The bracket comprises a side wall and at least one mounting member adjacent to the side wall. The second rail is movable relative to the first rail. The second rail comprises an upper wall, a lower wall and a longitudinal wall connected between the upper wall and the lower wall. The supporting member is arranged on the bracket. The supporting member comprises a supporting part protruded relative to the side wall of the bracket. Wherein, when the second rail is located at a retracted position relative to the first rail, the second rail is not extended beyond the supporting part of the supporting member.

Preferably, when the second rail is located at an extension position relative to the first rail, the second rail is partially extended beyond the supporting part of the supporting member.

Preferably, the supporting member is connected to the bracket. The supporting part of the supporting member is laterally arranged relative to a height direction of the side wall of the bracket.

According to another embodiment of the present invention, a slide rail assembly is applicable to a carried object. The carried object has a first side and a second side. The carried object comprises a front part and a rear part. The first side of the front part and the first side of the rear part of the carried object are substantially on a same plane. Wherein, the front part is formed with a space inside, and the first side of the front part has an opening communicated with the space. The slide rail assembly comprises a first rail, a bracket, a second rail and a supporting member. The bracket is attached to the first rail. The bracket comprises a side wall and at least one mounting member adjacent to the side wall. The second rail is movable relative to the first rail. The second rail is configured to be connected to the first side of the rear part of the carried object. The supporting member is arranged on the bracket. The supporting member comprises a supporting part. Wherein, when the second rail is located at a predetermined position relative to the first rail, the supporting part of the supporting member is configured to support the front part of the carried object.

Preferably, the slide rail assembly further comprises a third rail movably mounted between the first rail and the second rail for extending a traveling distance of the second rail relative to the first rail. When the second rail is located at the predetermined position relative to the first rail, a gap is defined between the first side of the front part of the carried object and one of the first rail and the third rail.

Preferably, the second rail is shorter than the first rail.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 is a diagram showing a rack system of a first embodiment of the present invention, wherein a carried object is retracted in a rack through a pair of slide rail assemblies;

FIG. 2 is an enlarged view of an area A of FIG. 1;

FIG. 5 is a diagram showing the rack system of the first embodiment of the present invention, wherein the carried object is moved out of the rack along a direction through the pair of slide rail assemblies;

FIG. 6 is an enlarged view of an area A of FIG. 5;

FIG. 9 is a diagram showing a rack system according to a second embodiment of the present invention; and FIG. 10 is an enlarged view of an area A of FIG. 9.

DETAILED DESCRIPTION

Figure 3:
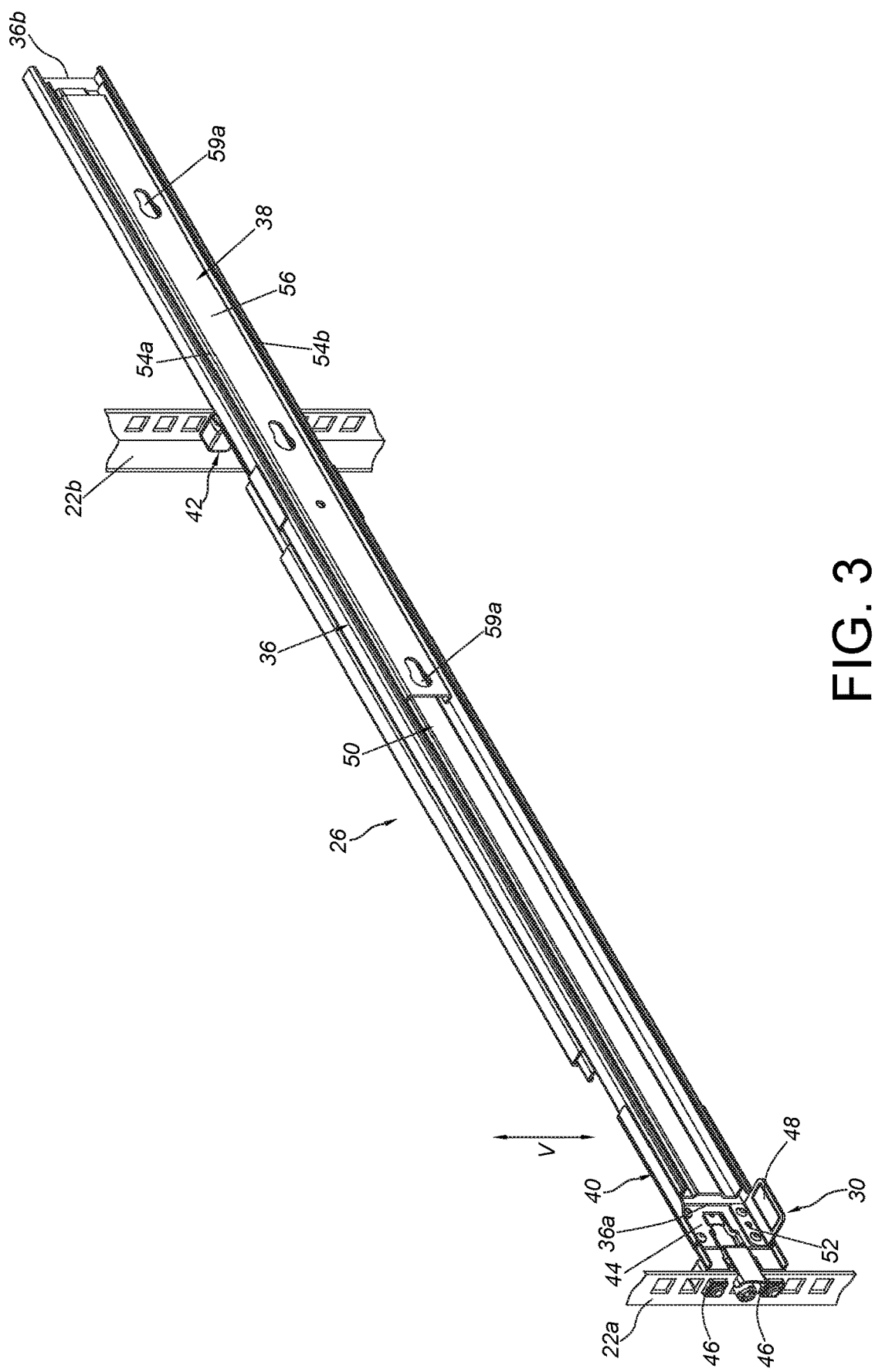
FIG. 3 is a diagram showing a slide rail assembly being mounted to posts of the rack according to the first embodiment of the present invention.

As shown in FIG. 1, a rack system 20 of a first embodiment of the present invention comprises a rack 22, a carried object 24, a first slide rail assembly 26, a second slide rail assembly 28 and at least one supporting member 30.

The rack 22 comprises a pair of first posts 22a and a pair of second posts 22b. In the present embodiment, the pair of first posts 22a and the pair of second posts 22b are correspondingly arranged and spaced from each other.

The carried object 24 can be a chassis of an electronic device, but the present invention is not limited thereto. Specifically, the carried object 24 has a first side S1 and a second side S2, and the carried object 24 comprises a front part 32 and a rear part 34. Preferably, the front part 32 and the rear part 34 of the carried object 24 form a cuboid-shaped object. The front part 32 of the carried object 24 is formed with a space 33 for accommodating electronic parts, such as a hard disc. Wherein, the front part 32 of the carried object 24 comprises a lower wall 32a. Preferably, the front part 32 of the carried object 24 further comprises an upper wall 32b, a rear wall 32c and a front wall 32d. The wall 32a, 32b, 32c, 32d are connected to each other to define the space 33.

The first slide rail assembly 26 and the second slide rail assembly 28 are respectively arranged at two opposite sides of the rack 22. Wherein, structural arrangement of the second slide rail assembly 28 is substantially identical to that of the first slide rail assembly 26. For simplification, only the first slide rail assembly 26 is illustrated.

The first slide rail assembly 26 comprises a first rail 36 and a second rail 38 movable relative to the first rail 36. The first rail 36 is mounted to the first post 22a of the rack 22 through a bracket 40, and is mounted to the second post 22b of the rack 22 through an adjustable bracket 42. The first rail 36 of the first slide rail assembly 26 and the first rail 36 of the second slide rail assembly 28 are respectively mounted to the corresponding first posts 22a of the rack 22 through respective brackets 40. On the other hands, the second rail 38 of the first slide rail assembly 26 and the second rail 38 of the second slide rail assembly 28 are respectively connected to the first side S1 and the second side S2 of the rear part 34 of the carried object 24.

As shown in FIG. 2, the supporting member 30 is connected to the bracket 40. Preferably, the bracket 40 comprises a side wall 44 and at least one mounting member 46 adjacent to the side wall 44. The at least one mounting member 46 is configured to be inserted into a hole H of the first post 22a. When the second rail 38 is located at a predetermined position (such as a retracted position L1) relative to the first rail 36, a supporting part 48 of the supporting member 30 is configured to support the front part 32 of the carried object 24. Preferably, the supporting part 48 is configured to support a bottom of the front part 32 of the carried object 24. Furthermore, when the second rail 38 is located at the retracted position L1 relative to the first rail 36, one end of the second rail 38 (such as a front end 38a) is not extended beyond the supporting part 48 of the supporting member 30.

Figure 4:
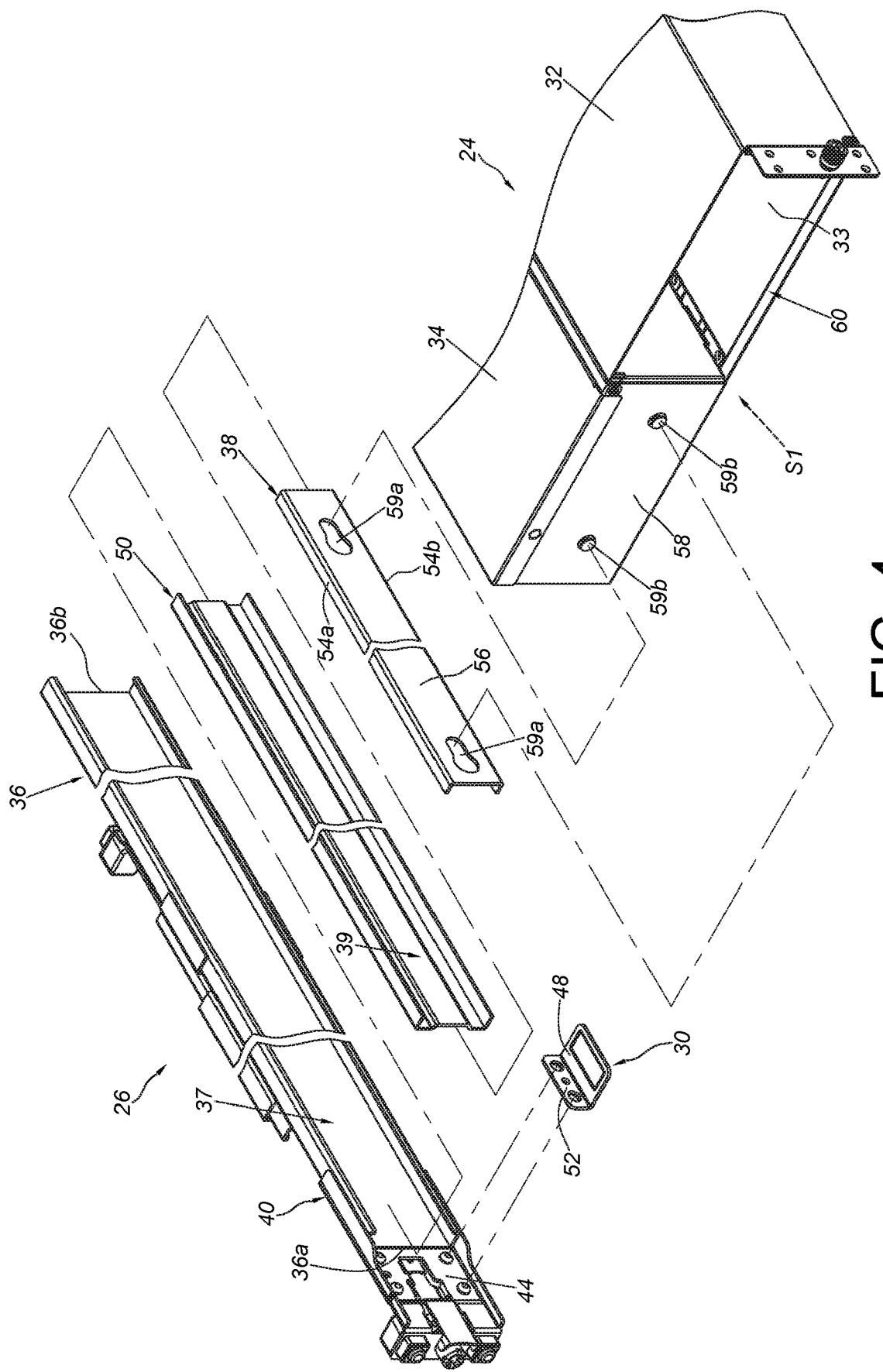
FIG. 4 is an exploded view of the slide rail assembly and the carried object according to the first embodiment of the present invention.

Preferably, as shown in FIG. 3 and FIG. 4, the first slide rail assembly 26 further comprises a third rail 50. The third rail 50 is movably mounted between the first rail 36 and the second rail 38 for extending a traveling distance of the second rail 38 relative to the first rail 36. Wherein, the first rail 36 has a front end 36a and a rear end 36b. A passage 37 is arranged between the front end 36a and the rear end 36b.

The bracket 40 is attached to the first rail 36. Preferably, the bracket 40 is connected to the first rail 36 and adjacent to the front end 36a of the first rail 36.

The supporting member 30 is arranged on the bracket 40, such as being arranged on the side wall 44 of the bracket 40. The supporting part 48 of the supporting member 30 is protruded relative to the side wall 44 of the bracket 40. In other words, the supporting part 48 is laterally (or horizontally) arranged relative to a height direction V (a double headed arrow shown in FIG. 3) of the side wall 44 of the bracket 40.

Preferably, the supporting member 30 further comprises a connecting part 52 substantially perpendicularly bent relative to the supporting part 48. The supporting part 48 is connected to the bracket 40 through the connecting part 52. Preferably, the connecting part 52 can be fixedly connected to the side wall 44 of the bracket 40 by riveting, screwing, engaging or welding. Or, in another embodiment, the side wall 44 of the bracket 40 can be integrally formed with the supporting part 48. The present invention is not limited thereto.

The third rail 50 is movably mounted into the passage 37 of the first rail 36. Similarly, the second rail 38 is movably mounted into a passage 39 of the third rail 50. Wherein, the second rail 38 comprises an upper wall 54a, a lower wall 54b and a longitudinal wall 56 connected between the upper wall 54a and the lower wall 54b. The second rail 38 of the first slide rail assembly 26 is connected to a wall 58 at the first side S1 of the rear part 34 of the carried object 24. The second rail 38 of the second slide rail assembly 28 is connected to the wall 58 at the second side S2 of the rear part 34 of the carried object 24 (please also refer to FIG. 7). For example, the longitudinal wall 56 of the second rail 38 has a plurality of mounting features 59a for mounting a plurality of connecting members 59b on the wall 58 of the carried object 24. Wherein, the first side S1 of the front part 32 of the carried object 24 has an opening 60 communicated with the space 33. A user can conveniently replace or maintain related electronic parts, such as a hard disc, in the space 33 of the carried object 24.

As shown in FIG. 5, the second rail 38 and the third rail 50 are movable relative to the first rail 36 along a direction D. Wherein, when the second rail 38 is moved to an extension position L2 relative to the first rail 36, a rail section X of the second rail 38 is extended beyond the supporting part 48 of the supporting member 30. Wherein, as shown in FIG. 6, when the second rail 38 is located at the extension position L2, the rest rail section of the second rail 38 is located above the supporting part 48 of the supporting member 30.

Figure 7:
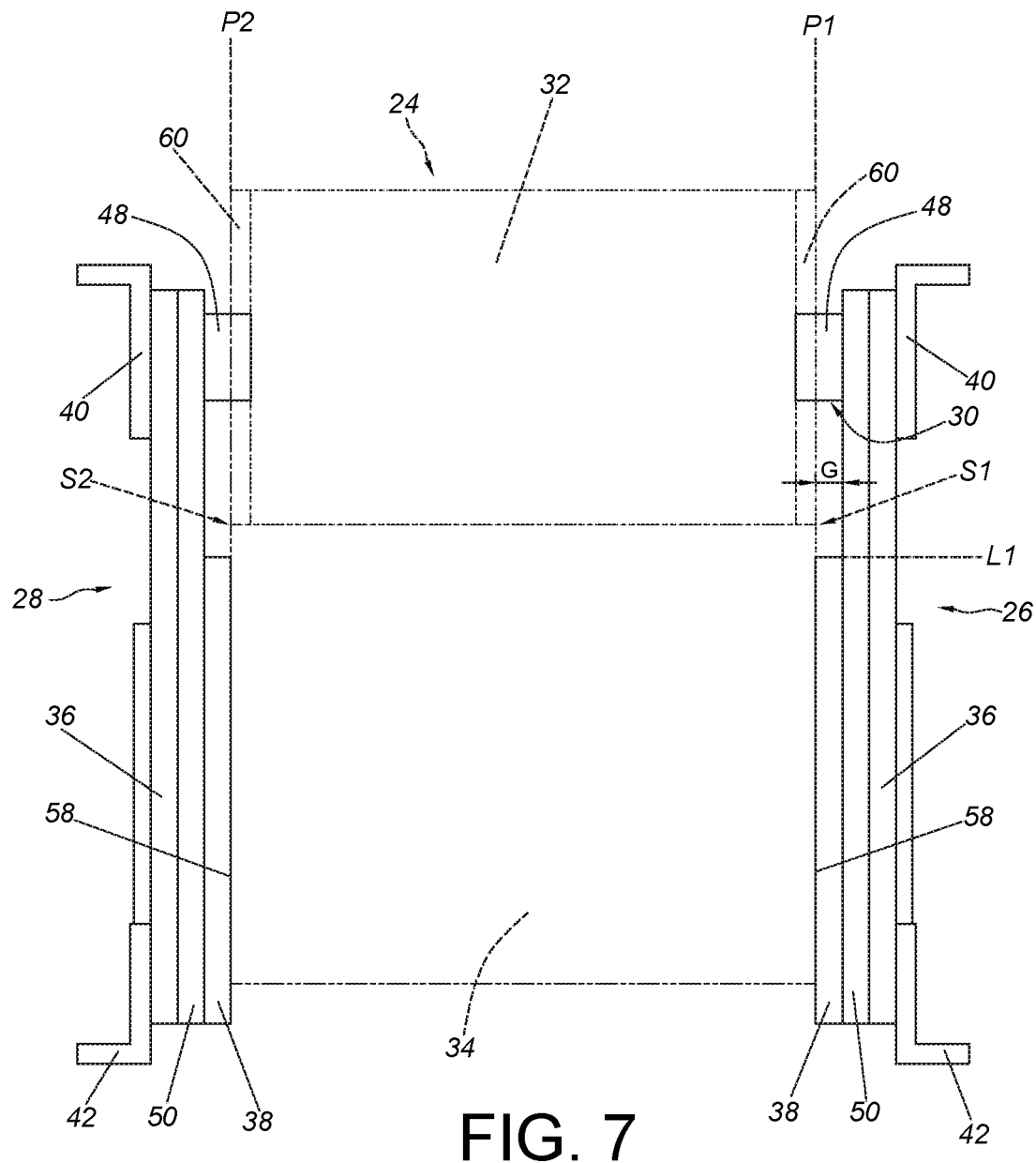
FIG. 7 is a diagram showing the carried object located at a position through the pair of slide rail assemblies according to the first embodiment of the present invention.

As shown in FIG. 7, the second rail 38 of the first slide rail assembly 26 (and the second rail 38 of the second slide rail assembly 28) is located at the predetermined position (such as the retracted position L1) relative to the first rail 36. Wherein, the first side S1 of the front part 32 and the first side S1 of the rear part 34 of the carried object 24 are substantially on a same plane P1, and the second side S2 of the front part 32 and the second side S2 of the rear part 34 of the carried object 24 are substantially on a same plane P2. Wherein, the planes P1, P2 are substantially parallel to each other. Since the first side S1 and/or the second side S2 of the front part 32 of the carried object 24 has the opening 60, the second rail 38 cannot be connected to the first side S1 and the second side S2 of the front part 32 of the carried object 24. In other words, in such situation, the second rail 38 must be configured to be shorter than the first rail 36 and/or the third rail 50, such that the second rails 38 of the first slide rail assembly 26 and the second slide rail assembly 28 can be only respectively connected to the walls 58 of the first side S1 and the second side S2 of the rear part 34 of the carried object 24. Wherein, the supporting part 48 of the supporting member 30 is configured to supporting a bottom of the front part 32 of the carried object 24, in order to prevent the front part 32 of the carried object 24 from falling due to overweight.

In addition, when the second rail 38 is located at the predetermined position relative to the first rail 36, a gap G is defined between the first side S1 of the front part 32 of the carried object 24 and one of the first rail 36 and the third rail 50. In the present embodiment, the gap G is defined between the first side S1 of the front part 32 of the carried object 24 and the third rail 50. When the electronic part in the space 33 of the front part 32 is powered, heat of the electronic part can be dissipated through the opening 60 and the gap G, so as to achieve heat dissipation effect.

Figure 8:
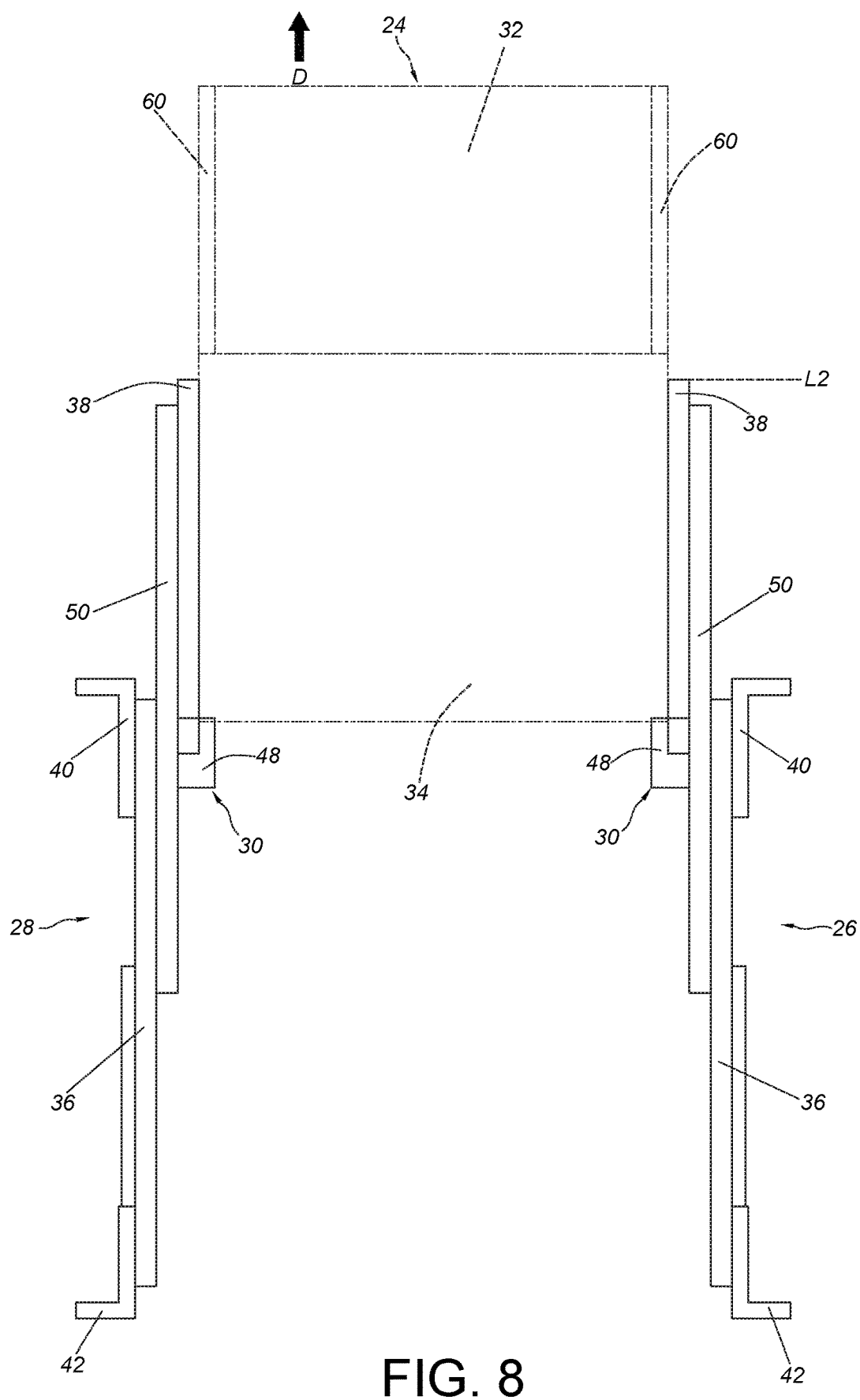
FIG. 8 is a diagram showing the carried object located at another position through a pair of slide rail assemblies according to the first embodiment of the present invention.

As shown in FIG. 8, the carried object 24 can be moved with the second rail 38 relative to the first rail 36 along the direction D to the extension position L2. Wherein, the user can take out the electronic part from the space 33 of the front part 32 of the carried object 24 through the opening 60, or place the electronic part into the space 33 of the front part 32 through the opening 60. Such arrangement can facilitate maintenance operation of the electronic part.

As shown in FIG. 9 and FIG. 10, different from the supporting member 30 of the first embodiment being connected to the bracket 40, a supporting member 200 of a second embodiment is connected to the first post 22a of the rack 22.

Specifically, a connecting part 202 of the supporting member 200 is substantially perpendicularly bent relative to a supporting part 204. The connecting part 202 can be fixedly connected to the first post 22a by riveting, screwing, engaging or welding. In the present embodiment, the connecting part 202 is fixedly connected to the first post 22a by screwing. Wherein, the supporting part 204 of the supporting member 200 is laterally (or horizontally) arranged relative to the height direction V of the first post 22a. As such, when the second rail 38 is located at the predetermined position relative to the first rail 36, the supporting part 204 of the supporting member 200 can support the carried object 24 as well.

Therefore, the rack system and/or the slide rail assembly of the present invention are characterized in that:

1. In a situation that the second rail of the slide rail assembly can be only connected to the rear part of the carried object, the supporting member can be used to support the front part of the carried object, in order to prevent the carried object from being tiled or falling due to overweight. Wherein, the supporting member can be connected to the bracket or the post.

2. The front part of the carried object has the space for accommodating related components (such as the electronic parts), and at least one of the first side and the second side of the front part has the opening communicated with the space, such that an on-site person can conveniently perform maintenance operation of the electronic parts in the front part of the carried object.

3. When the second rail is located at the predetermined position relative to the first rail, a gap is defined between the first side of the front part of the carried object and the first rail (or the third rail), in order to facilitate heat dissipation of the electronic parts in the front part of the carried object.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rack system, comprising:
   a rack;
   a carried object comprising a front part and a rear part, wherein a first side of the front part and a first side of the rear part of the carried object are substantially on a same plane, and a second side of the front part and a second side of the rear part of the carried object are substantially on a same plane, wherein the front part is formed with a space inside, and the first side of the front part has an opening communicated with the space;
   a first slide rail assembly and a second slide rail assembly respectively arranged at two opposite sides of the rack, each of the slide rail assemblies comprising a first rail, a second rail movable relative to the first rail, and a third rail movably mounted between the first rail and the second rail for extending a traveling distance of the second rail relative to the first rail, each of the first rails of the slide rail assemblies being mounted to a post of the rack through a bracket, and the second rail of the first slide rail assembly and the second rail of the second slide rail assembly being respectively mounted to the first side and the second side of the rear part and not mounted to the first side and the second side of the front part; and
   a supporting member fixedly and directly connected to one of the bracket and the post, wherein the supporting member comprises a supporting part, and the supporting part is horizontally arranged relative to a height direction of one of the bracket and the post;

wherein the third rail is movably mounted into a passage of the first rail, and the second rail is movably mounted into a passage of the third rail;

wherein when the second rail is located at a retracted position relative to the first rail, a horizontal upper surface of the supporting member is configured to directly support a horizontal bottom surface of the front part of the carried object with the opening being located above the supporting member, and a gap outside the carried object is defined between the first side of the front part of the carried object and the third rail;

wherein when the second rail is located at an extension position, the third rail is located behind the opening without blocking the opening.

2. The rack system of claim 1, wherein the supporting member further comprises a connecting part, the connecting part is substantially perpendicularly bent relative to the supporting part, and the supporting part is connected to one of the bracket and the post through the connecting part.

3. The rack system of claim 1, wherein the second rail is shorter than the first rail and the third rail.

4. An assembly, comprising:
a first rail;
a bracket attached to the first rail, the bracket comprising a side wall and at least one mounting member adjacent to the side wall;
a second rail movable relative to the first rail, the second rail comprising an upper wall, a lower wall and a longitudinal wall connected between the upper wall and the lower wall;
a third rail movably mounted between the first rail and the second rail for extending a traveling distance of the second rail relative to the first rail;
a carried object attached to the second rail; and
a supporting member fixedly and directly connected to the bracket, the supporting member comprising a supporting part protruded relative to the side wall of the bracket, wherein the supporting part of the supporting member is horizontally arranged relative to a height direction of the side wall of the bracket, the supporting part has a horizontal upper surface configured to directly support a horizontal bottom surface of the carried object attached to the second rail;
wherein the third rail is movably mounted into a passage of the first rail, and the second rail is movably mounted into a passage of the third rail;
wherein the carried object comprises a front part and a rear part, a first side of the front part and a first side of the rear part of the carried object are substantially on a same plane, wherein the front part is formed with a space inside, and the first side of the front part has an opening communicated with the space; wherein the second rail is configured to be connected to the first side of the rear part of the carried object and not connected to the first side of the front part of the carried object;
wherein when the second rail is located at a retracted position relative to the first rail, the second rail is not extended beyond the supporting part of the supporting member with the opening being located above the supporting member, and a gap outside the carried object is defined between the first side of the front part of the carried object and the third rail;

wherein when the second rail is located at an extension position, the third rail is located behind the opening without blocking the opening.

5. The slide rail assembly of claim 4, wherein when the second rail is located at an extension position relative to the first rail, the second rail is partially extended beyond the supporting part of the supporting member.

6. The slide rail assembly of claim 4, wherein the supporting member further comprises a connecting part, the connecting part is substantially perpendicularly bent relative to the supporting part, and the supporting part is connected to the bracket through the connecting part.

7. The slide rail assembly of claim 4, wherein the second rail is shorter than the first rail.

8. An assembly comprising a slide rail assembly and a carried object mounted to the slide rail assembly, the carried object comprising a front part and a rear part, wherein a first side of the front part and a first side of the rear part of the carried object are substantially on a same plane, wherein the front part is formed with a space inside, and the first side of the front part has an opening communicated with the space, the slide rail assembly comprising:
a first rail;
a bracket attached to the first rail, the bracket comprising a side wall and at least one mounting member adjacent to the side wall;
a second rail movable relative to the first rail, the second rail configured to be connected to the first side of the rear part of the carried object and not connected to the first side of the front part;
a third rail movably mounted between the first rail and the second rail for extending a traveling distance of the second rail relative to the first rail; and
a supporting member fixedly and directly connected to the bracket, the supporting member comprising a supporting part, wherein the supporting part of the supporting member is horizontally arranged relative to a height direction of the side wall of the bracket;
wherein the third rail is movably mounted into a passage of the first rail, and the second rail is movably mounted into a passage of the third rail;
wherein when the second rail is located at a retracted position relative to the first rail, a horizontal upper surface of the supporting part of the supporting member is configured to directly support a horizontal bottom surface of the front part of the carried object with the opening being located above the supporting member, and a gap outside the carried object is defined between the first side of the front part of the carried object and the third rail;
wherein when the second rail is located at an extension position, the third rail is located behind the opening without blocking the opening.

9. The slide rail assembly of claim 8, wherein the supporting part of the supporting member is protruded relative to the side wall of the bracket.

10. The slide rail assembly of claim 8, wherein the supporting member further comprises a connecting part, the connecting part is substantially perpendicularly bent relative to the supporting part, and the supporting part is connected to the bracket through the connecting part.

11. The slide rail assembly of claim 8, wherein the second rail is shorter than the first rail.

* * * * *